US009877387B2

(12) United States Patent
Kajita et al.

(10) Patent No.: US 9,877,387 B2
(45) Date of Patent: Jan. 23, 2018

(54) WIRING BOARD AND MOUNTING STRUCTURE USING SAME

(71) Applicant: KYOCERA Corporation, Kyoto-shi, Kyoto (JP)

(72) Inventors: Satoshi Kajita, Kyoto (JP); Mitsuhiro Hagihara, Kyoto (JP); Yuuhei Matsumoto, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 206 days.

(21) Appl. No.: 14/779,232

(22) PCT Filed: Mar. 26, 2014

(86) PCT No.: PCT/JP2014/058548
§ 371 (c)(1),
(2) Date: Sep. 22, 2015

(87) PCT Pub. No.: WO2014/157342
PCT Pub. Date: Oct. 2, 2014

(65) Prior Publication Data
US 2016/0150642 A1 May 26, 2016

(30) Foreign Application Priority Data

Mar. 27, 2013 (JP) ................................. 2013-066115
Apr. 25, 2013 (JP) ................................. 2013-092259

(51) Int. Cl.
*H05K 7/00* (2006.01)
*H05K 1/03* (2006.01)
(Continued)

(52) U.S. Cl.
CPC ......... *H05K 1/0306* (2013.01); *H05K 1/0298* (2013.01); *H05K 1/036* (2013.01);
(Continued)

(58) Field of Classification Search
CPC .... H05K 1/0298; H05K 1/0306; H05K 1/036; H05K 1/09; H05K 1/115; H05K 1/181;
(Continued)

(56) References Cited

U.S. PATENT DOCUMENTS

2011/0240351 A1* 10/2011 Wakita ................. H05K 3/4644
174/258
2012/0189818 A1* 7/2012 Hayashi ............... H05K 3/4602
428/161

(Continued)

FOREIGN PATENT DOCUMENTS

JP 04-122087 A 4/1992
JP 2005-236150 A 9/2005
(Continued)

OTHER PUBLICATIONS

International Search Report, PCT/JP2014/058548, dated May 13, 2014, 2 pgs.

(Continued)

*Primary Examiner* — Yuriy Semenenko
(74) *Attorney, Agent, or Firm* — Volpe and Koenig, P.C.

(57) ABSTRACT

A wiring board includes: an inorganic insulating layer having a via hole formed so as to penetrate the inorganic insulating layer in a thickness direction thereof; a conductive layer disposed on the inorganic insulating layer; and a via conductor which adheres to an inner wall of the via hole and is connected with the conductive layer. The inorganic insulating layer includes a first section including a plurality of inorganic insulating particles partly connected to each other, and a resin portion located in gaps between the inorganic insulating particles, and a second section which is interposed between the first section and the via conductor, including a plurality of inorganic insulating particles partly connected to each other, and a conducting portion composed of part of the
(Continued)

via conductor which is located in gaps between the inorganic insulating particles.

7 Claims, 9 Drawing Sheets

(51) Int. Cl.
| | |
|---|---|
| *H05K 1/11* | (2006.01) |
| *H05K 3/42* | (2006.01) |
| *H05K 1/02* | (2006.01) |
| *H05K 1/09* | (2006.01) |
| *H05K 1/18* | (2006.01) |
| *H05K 3/46* | (2006.01) |
| *H05K 3/00* | (2006.01) |

(52) U.S. Cl.
CPC .............. *H05K 1/09* (2013.01); *H05K 1/115* (2013.01); *H05K 1/181* (2013.01); *H05K 3/421* (2013.01); *H05K 3/4655* (2013.01); H05K 3/0038 (2013.01); H05K 3/4602 (2013.01); H05K 2201/0116 (2013.01); H05K 2201/0195 (2013.01); H05K 2201/0209 (2013.01); H05K 2201/0266 (2013.01); H05K 2201/09845 (2013.01); H05K 2201/09854 (2013.01); H05K 2201/09863 (2013.01); H05K 2201/2072 (2013.01)

(58) Field of Classification Search
CPC ... H05K 2201/0116; H05K 2201/0195; H05K 2201/0209; H05K 2201/0266; H05K 2201/09845; H05K 2201/09854; H05K 2201/09863

See application file for complete search history.

(56) References Cited

U.S. PATENT DOCUMENTS

2013/0118792 A1* 5/2013 Min .................. H05K 1/02
174/262
2013/0153279 A1 6/2013 Hayashi

FOREIGN PATENT DOCUMENTS

| JP | 2012-178499 A | | 9/2012 | |
|---|---|---|---|---|
| JP | 2012178499 a | * | 9/2012 | .............. H05K 1/03 |
| JP | 2013-028145 A | | 2/2013 | |
| WO | 2012/029622 A1 | | 3/2012 | |

OTHER PUBLICATIONS

Extended European Search Report, European Patent Application No. 14774851.1, dated Dec. 20, 2016, 10 pgs.

* cited by examiner (a)

(b)

(a)

(b)

(c)

(d)

(a)

(b)

(a)

(b)

(a)

(b)

(c)

(d)

(a)

(b)

(a)

(b)

(a)

(b)

(a)

(b)

WIRING BOARD AND MOUNTING STRUCTURE USING SAME

TECHNICAL FIELD

The present invention relates to a wiring board for use in electronic equipment (for example, audio visual equipment of various types, household electrical appliances, communications equipment, computer equipment, and computer peripherals), and a mounting structure using the wiring board.

BACKGROUND ART

A mounting structure constructed by mounting an electronic component on a wiring board has conventionally been used for electronic equipment.

As an example of the wiring board, there is a construction comprising an inorganic insulating layer (ceramic layer) and an electrically-conductive layer (nickel thin layer) disposed on the inorganic insulating layer (for example, refer to Japanese Unexamined Patent Publication JP-A 4-122087 (1992)).

In such a wiring board, to provide electrical connection between electrically-conductive layers disposed above and below the inorganic insulating layer, there may be a case where a through hole is formed so as to penetrate the insulating layer in a thickness direction thereof, and a through conductor is formed so as to adhere to the inner wall of the through hole while being electrically connected to the electrically-conductive layers.

In this case, when the wiring board is subjected to heat at the time of installation or actuation of an electronic component, due to the difference in thermal expansion coefficient between the inorganic insulating layer and the through conductor in the thickness direction, a thermal stress is applied between the through conductor and the inner wall of the through hole, thus causing the through conductor to separate from the inner wall of the through hole. When the separation is increased and reaches the junction between the through conductor and the electrically-conductive layer, cracking may occur in the junction. This leads to a break in the wiring of the wiring board, thus causing a decline in the electrical reliability of the wiring board.

Hence, provision of a wiring board having excellent electrical reliability is demanded.

An object of the invention is to provide a wiring board having excellent electrical reliability, and a mounting structure using the wiring board.

SUMMARY OF INVENTION

A wiring board in accordance with an embodiment of the invention includes: an inorganic insulating layer having a through hole formed so as to penetrate the inorganic insulating layer in a thickness direction thereof; a conductive layer disposed on the inorganic insulating layer; and a through conductor which adheres to an inner wall of the through hole and is connected with the conductive layer, the inorganic insulating layer comprising a first section including a plurality of inorganic insulating particles partly connected to each other, and a resin portion located in gaps between the inorganic insulating particles, and a second section which is interposed between the first section and the through conductor, including the plurality of inorganic insulating particles partly connected to each other, and a conducting portion composed of part of the through conductor which is located in the gaps between the inorganic insulating particles.

A mounting structure in accordance with an embodiment of the invention includes: the wiring board mentioned above; and an electronic component mounted on the wiring board so as to be electrically connected to the conductive layer.

According to the wiring board in accordance with an embodiment of the invention, the second section including a plurality of first inorganic insulating particles partly connected to each other and a conductor portion composed of part of the through conductor located in gaps between the first inorganic insulating particles is interposed between the first section and the through conductor.

This makes it possible to reduce the thermal stress applied between the through conductor and the inner wall of the through hole, and thereby suppress separation of the through conductor from the inner wall of the through hole. Accordingly, it is possible to suppress occurrence of cracking in the junction between the through conductor and the conductive layer, wherefore it is possible to obtain the wiring board having excellent electrical reliability.

According to the mounting structure in accordance with an embodiment of the invention, since the aforestated wiring board is provided, it is possible to obtain the mounting structure having excellent electrical reliability.

DESCRIPTION OF EMBODIMENTS

Hereinafter, a mounting structure including a wiring board in accordance with an embodiment of the invention will be described in detail with reference to drawings.

Figure 1:
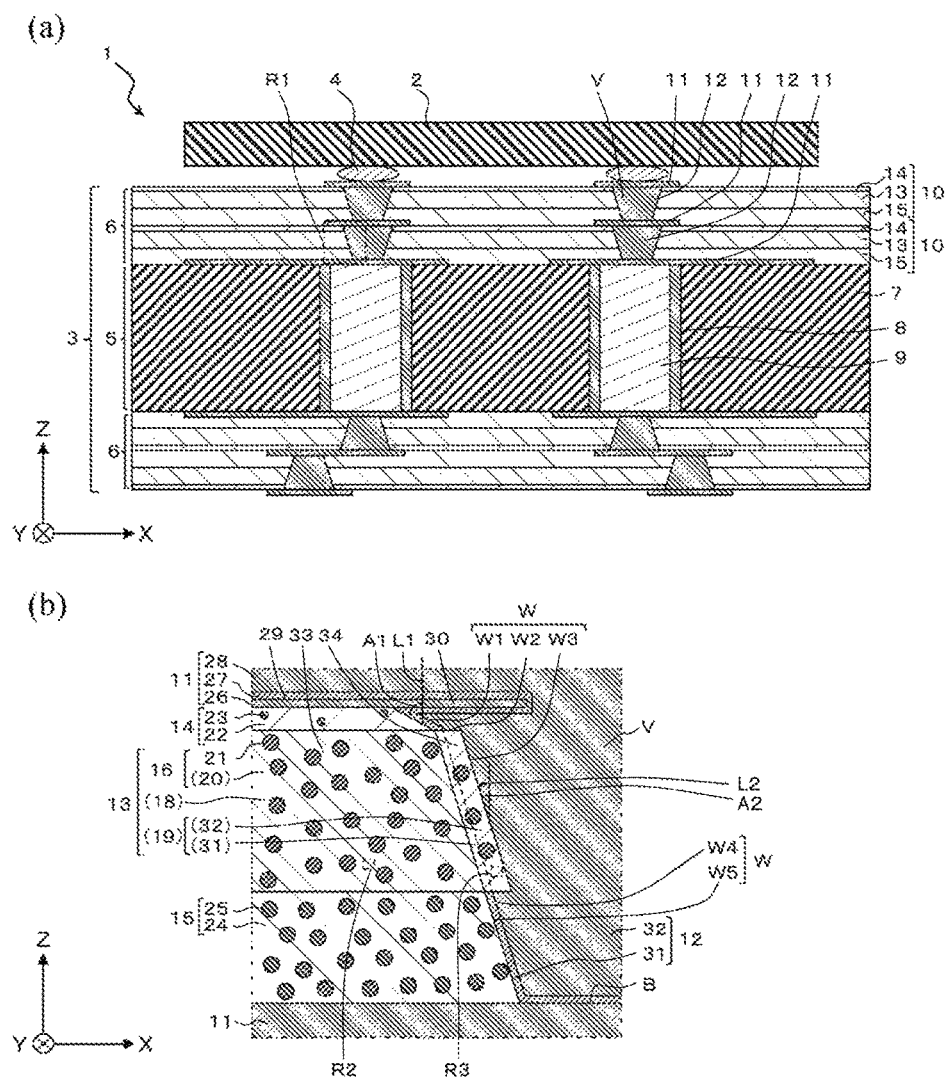
FIG. 1($a$) is a sectional view of a mounting structure in accordance with an embodiment of the invention taken along a thickness direction thereof, and FIG. 1($b$) is an enlarged sectional view showing a part R1 depicted in FIG. 1($a$)

A mounting structure 1 as shown in FIG. 1(a) is used for electronic equipment such for example as audio visual equipment of various types, household electrical appliances, communications equipment, computer apparatuses or computer peripherals. The mounting structure 1 comprises an electronic component 2 and a wiring board 3 on which the electronic component 2 is mounted.

For example, the electronic component 2 is a semiconductor device such as IC or LSI, or an elastic wave device such as a surface acoustic wave (SAW) device or a film bulk acoustic resonator (FBAR). The electronic component 2 is flip-chip mounted on the wiring board 3 via a bump 4 made of an electrically-conductive material such as solder. For example, the thickness of the electronic component 2 falls in the range of 0.1 mm or above and 1 mm or below. Moreover, for example, the coefficient of thermal expansion of the electronic component 2 in each direction falls in the range of 2 ppm/° C. or above and 14 ppm/° C. or below. The coefficient of thermal expansion of the electronic component 2 is measured by a measurement method in compliance with JIS K 7197-1991 using commercially available TMA (Thermo-Mechanical Analysis) equipment. In what follows, the coefficient of thermal expansion of each member will be determined by a measurement method similar to that adopted for the electronic component 2.

The wiring board 3 serves to support the electronic component 2 and provide the electronic component 2 with the supply of power and signals to drive or control the electronic component 2. The wiring board 3 comprises a core substrate 5 and paired buildup layers 6 formed on the upper surface and lower surface, respectively, of the core substrate 5. For example, the thickness of the wiring board 3 falls in the range of 0.05 mm or above and 1.5 mm or below. For example, the coefficient of thermal expansion of the wiring board 3 in a direction of a main face (the direction of XY plane) thereof falls in the range of 4 ppm/° C. or above and 20 ppm/° C. or below.

The core substrate 5 provides continuity between the paired buildup layers 6 while enhancing the rigidity of the wiring board 3. The core substrate 5 comprises: a base body 7 for supporting the buildup layers 6; a cylindrical through hole conductor 8 disposed in a through hole that penetrates the base body 7 in a thickness direction thereof; and a columnar insulator 9 surrounded by the through hole conductor 8.

The base body 7 imparts high rigidity and low thermal expansion coefficient to the wiring board 3. For example, the base body 7 comprises: a resin such as epoxy resin; a base material such as resin-coated glass cloth; and filler particles dispersed within the resin and made for example of silicon oxide.

The through hole conductor 8 provides electrical connection between the paired buildup layers 6. The through hole conductor 8 comprises an electrically-conductive material such for example as copper.

The insulator 9 fills in a space surrounded by the through hole conductor 8. The insulator 9 comprises a resin such for example as epoxy resin.

As described above, the paired buildup layers 6 are formed on the upper surface and lower surface, respectively, of the core substrate 5. One buildup layer 6 of the paired buildup layers 6 is connected to the electronic component 2 via the bump 4, whereas the other buildup layer 6 is connected to an external circuit (not shown in the drawing) via a solder ball (not shown), for example.

The buildup layer 6 comprises: a plurality of insulating layers 10 having via holes (through holes) V penetrated in a thickness direction (Z direction); a plurality of conductive layers 11 partly disposed on the base body 7 or the insulating layer 10; and a plurality of via conductors (through conductors) 12 that adhere to an inner wall W of a via hole V while being connected to the conductive layers 11.

The insulating layer 10 serves as an insulating member for electrical isolation between the conductive layers 11 spaced apart in the thickness direction or in the direction of the main face, as well as between the via conductors 12 spaced apart in the direction of the main face. For example, the thickness of the insulating layer 10 falls in the range of 15 μm or above and 50 μm or below.

Moreover, the insulating layer 10 comprises: an inorganic insulating layer 13; a first resin layer 14, which is smaller in thickness than the inorganic insulating layer 13, interposed between the inorganic insulating layer 13 and the conductive layer 11 while being kept in contact with the inorganic insulating layer 13 and the conductive layer 11; and a second resin layer 15, which is larger in thickness than the first resin layer 14, disposed on the inorganic insulating layer 13 on an opposite side to the first resin layer 14 side of the inorganic insulating layer 13 while being kept in contact with the inorganic insulating layer 13.

In consequence of the interposition of the first resin layer 14 which is smaller in Young's modulus than the inorganic insulating layer 13 between the inorganic insulating layer 13 and the conductive layer 11, the thermal stress applied to the junction between the conductive layer 11 and the via conductor 12 can be reduced. Moreover, the thickness of the first resin layer 14 is smaller than the thickness of the inorganic insulating layer 13, wherefore the thicknesswise thermal expansion coefficient of the insulating layer 10 is reduced to a level approximate to that of the via conductor 12, thus reducing the thermal stress applied to the junction between the conductive layer 11 and the via conductor 12.

Figure 2:
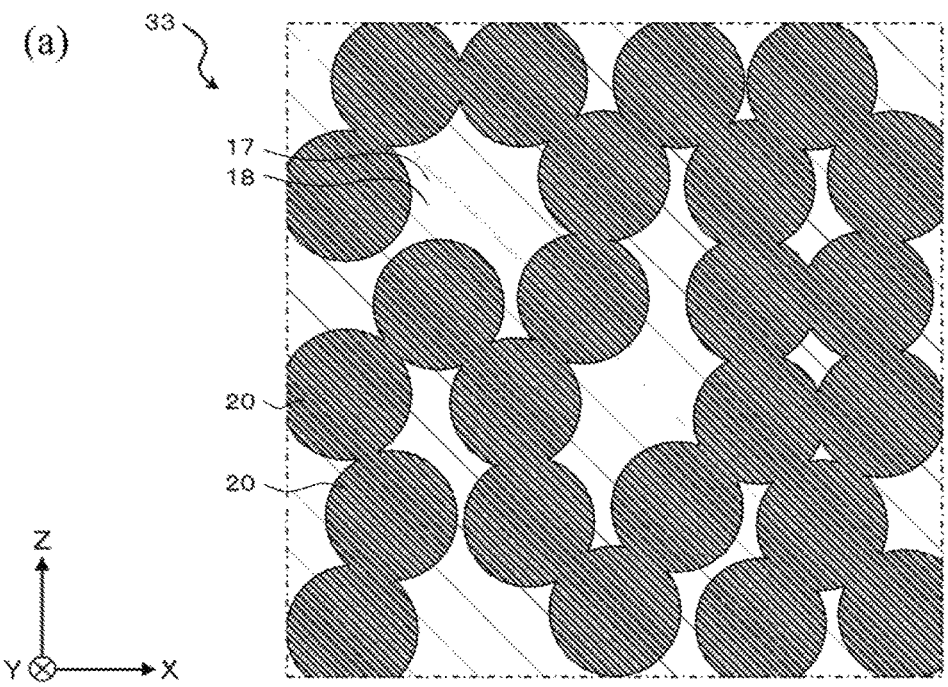
FIG. 2($a$) is an enlarged sectional view showing a part R2 depicted in FIG. 1($b$), and FIG. 2($b$) is an enlarged sectional view showing a part R3 depicted in FIG. 1($b$)
Figure 2:
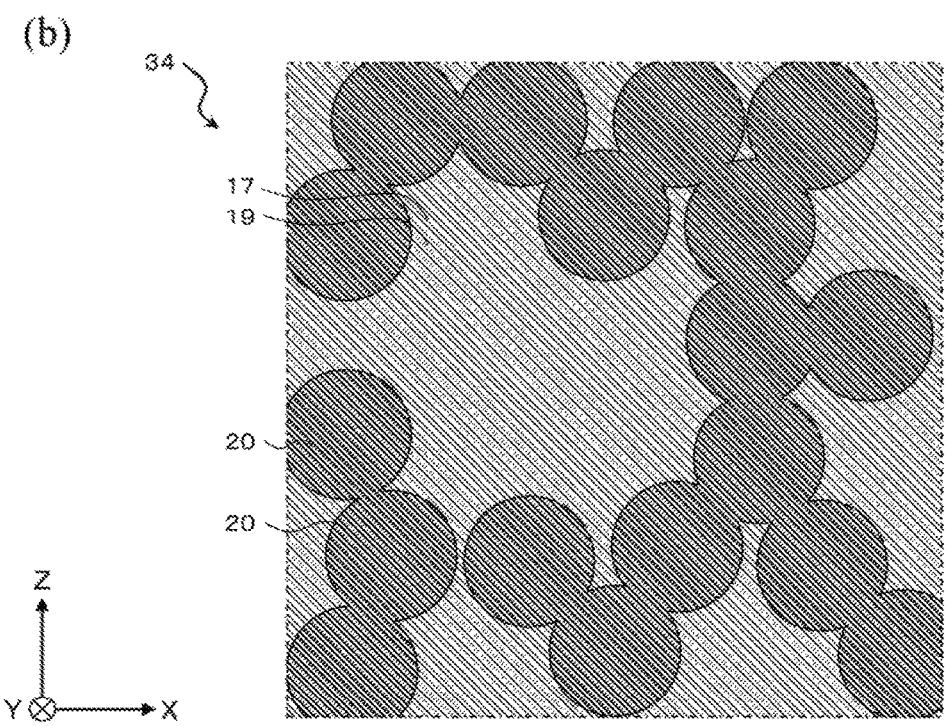

As shown in FIGS. 1(b) and 2, the inorganic insulating layer 13 includes a plurality of inorganic insulating particles 16 partly connected to each other, a resin portion 18 located in a part of gaps 17 between the inorganic insulating particles 16, and a conductor portion 19 composed of part of the via conductor 12 which is located in the other part of the gaps 17 between the inorganic insulating particles 16.

The inorganic insulating layer 13 is greater in Young's modulus and yet is smaller in thermal expansion coefficient in each direction than the first resin layer 14 and the second resin layer 15. In this case, the difference in thermal expansion coefficient between the electronic component 2 and the wiring board 3 can be reduced, and therefore, even when the mounting structure 1 is subjected to heat at the time of installation or actuation of the electronic component 2, warpage resulting from the difference in thermal expansion coefficient between the electronic component 2 and the wiring board 3 can be minimized. This makes it possible to suppress breakage caused by the warpage in the junction between the electronic component 2 and the wiring board 3, and thereby increase the reliability of connection between the electronic component 2 and the wiring board 3.

Moreover, with the inclusion of the inorganic insulating particles 16 connected to each other, the inorganic insulating layer 13 takes on the form of a porous body having a three-dimensional network structure. The resin portion 18 is disposed in a part of the gaps 17 of the porous body, and the conductor portion 19 is located in the other part of the gaps 17. A connection part between a plurality of the inorganic insulating particles 16 has the form of a constriction, thus providing a necked-down structure. For example, the thickness of the inorganic insulating layer 13 falls in the range of 3 μm or above and 30 μm or below. For example, the Young's modulus of the inorganic insulating layer 13 falls in the range of 10 GPa or above and 50 GPa or below. Moreover, for example, the coefficient of thermal expansion of the inorganic insulating layer 13 in each direction falls in the range of 0 ppm/° C. or above and 10 ppm/° C. or below.

The plurality of inorganic insulating particles 16 are partly connected to each other, and are therefore mutually restrained against flowing movement, thus achieving an increase in Young's modulus and a decrease in thermal expansion coefficient in each direction in the inorganic insulating layer 13. The inorganic insulating particles 16 include a plurality of first inorganic insulating particles 20 partly connected to each other, and a plurality of second inorganic insulating particles 21 that are greater in particle size than the first inorganic insulating particles 20, are partly connected to the first inorganic insulating particles 20, and are spaced away from each other across the first inorganic insulating particle 20. The second inorganic insulating particle 21 and the first inorganic insulating particle 20 are partly connected to each other, and, the plurality of second inorganic insulating particles 21 adhere to each other through the first inorganic insulating particle 20.

The first inorganic insulating particles 20 serve as connecting components in the inorganic insulating layer 13. Moreover, as will hereafter be described, since the first inorganic insulating particles 20 adhere firmly because of their small average particle size, it is possible to impart low thermal expansion coefficient and high Young's modulus to the inorganic insulating layer 13. The first inorganic insulating particle 20 is made of an inorganic insulating material such for example as silicon oxide or aluminum oxide, or preferably contains silicon oxide as a major constituent. Silicon oxide allows reduction of anisotropy in thermal expansion coefficient ascribable to a crystalline structure, and it is thus desirable to adopt an amorphous (non-crystalline) form. For example, the content percentage of silicon oxide in the first inorganic insulating particle 20 falls in the range of 99.9% by mass or above and 100% by mass or below.

For example, the first inorganic insulating particle 20 has a spherical shape. The average particle size of the first inorganic insulating particles 20 falls in the range of 3 nm or above and 110 nm or below. Moreover, for example, the Young's modulus of the first inorganic insulating particle 20 falls in the range of 40 GPa or above and 90 GPa or below. Furthermore, for example, the coefficient of thermal expansion of the first inorganic insulating particle 20 in each direction falls in the range of 0 ppm/° C. or above and 15 ppm/° C. or below. The average particle size of the first inorganic insulating particles 20 can be determined by calculation to obtain the average of the diameters of individual particles at the thicknesswise section of the wiring board 3. In what follows, the average particle size of each component will be determined by a measurement method similar to that adopted for the first inorganic insulating particles 20.

The second inorganic insulating particle 21 suppresses the propagation of a crack developed in the inorganic insulating layer 13. A component which is similar in material and characteristics to the first inorganic insulating particle 20 can be used for the second inorganic insulating particle 21. For example, the second inorganic insulating particle 21 has a spherical shape, and the average particle size of the second inorganic insulating particles 21 falls in the range of 0.5 μm or above and 5 μm or below.

The gaps 17 are open pore openings into one main face and the other main face of the inorganic insulating layer 13. Moreover, since the plurality of inorganic insulating particles 16 partly connected to each other constitute a porous body, it follows that the gaps 17 are, at least partly, surrounded by the inorganic insulating particles 16 at the thicknesswise section of the inorganic insulating layer 13.

The resin portion 18, being made of a resin material which becomes elastically deformed more easily than an inorganic insulating material, reduces the stress applied to the inorganic insulating layer 13 to suppress occurrence of cracking in the inorganic insulating layer 13. The resin portion 18 of the present embodiment is part of the second resin layer 15 which has found its way into the gaps 17. This helps increase the strength of adhesion between the inorganic insulating layer 13 and the second resin layer 15.

The first resin layer 14 serves to relax the thermal stress applied between the inorganic insulating layer 13 and the conductive layer 11. For example, the thickness of the first resin layer 14 falls in the range of 0.1 μm or above and 5 μm or below. For example, the Young's modulus of the first resin layer 14 falls in the range of 0.05 GPa or above and 5 GPa or below. For example, the coefficient of thermal expansion of the first resin layer 14 in each direction falls in the range of 20 ppm/° C. or above and 100 ppm/° C. or below.

As shown in FIG. 1(b), the first resin layer 14 comprises a first resin 22 and a plurality of first filler particles 23 dispersed in the first resin 22. For example, the content percentage of the first filler particles 23 in the first resin layer 14 falls in the range of 0.05% by volume or above and 10% by volume or below. The content percentage of the first filler particles 23 in the first resin layer 14 can be determined by defining the ratio of the area of the first filler particles 23 constituting the first resin layer 14 at the thicknesswise section of the wiring board 3 as the first-filler-particle content (% by volume). In what follows, the content percentage of particles of each component will be determined by a measurement method similar to that adopted for the first filler particles 23.

The first resin 22 is made of a resin material such for example as epoxy resin, bismaleimide triazine resin, cyanate resin, or polyimide resin. Among them, epoxy resin is desirable for use. For example, the Young's modulus of the first resin 22 falls in the range of 0.1 GPa or above and 5 GPa or below. For example, the coefficient of thermal expansion of the first resin 22 in each direction falls in the range of 20 ppm/° C. or above and 50 ppm/° C. or below.

A component which is similar in material and characteristics to the earlier described second inorganic insulating particle 21 can be used for the first filler particle 23. For example, the first filler particle 23 has a spherical shape, and the average particle size of the first filler particles 23 falls in the range of 0.05 µm or above and 0.7 µm or below.

The second resin layer 15 serves as a bonding member for adhesion between the insulating layers 10. Part of the second resin layer 15 is disposed between the conductive layers 11 spaced apart in the direction of the main face, and, the second resin layer 15 is greater in thickness than the first resin layer 14. In consequence of designing the second resin layer 15 to have a thickness larger than the thickness of the first resin layer 14, the second resin layer 15 is readily filled in between the conductive layers 11, thus reducing clearance between the conductive layers 11. This helps enhance electrical isolation between the conductive layers 11. For example, the thickness of the second resin layer 15 falls in the range of 3 µm or above and 30 µm or below. For example, the Young's modulus of the second resin layer 15 falls in the range of 0.2 GPa or above and 20 GPa or below. For example, the coefficient of thermal expansion of the second resin layer 15 in each direction falls in the range of 20 ppm/° C. or above to 50 ppm/° C. or below.

As shown in FIG. 1(b), the second resin layer 15 comprises a second resin 24 and a plurality of second filler particles 25 dispersed in the second resin 24. For example, the content percentage of the second filler particles 25 in the second resin layer 15 falls in the range of 3% by volume or above to 60% by volume or below. A component which is similar in material and characteristics to the first resin 22 can be used for the second resin 24. A component which is similar in material and characteristics to the first filler particle 23 can be used for the second filler particle 25. For example, the average particle size of the second filler particles 25 falls in the range of 0.5 µm or above and 5 µm or below.

The content percentage of the first filler particles 23 in the first resin layer 14 is smaller than the content percentage of the second filler particles 25 in the second resin layer 15. Consequently, at a corner of the insulating layer 10 located at the junction between the conductive layer 11 and the via conductor 12, the Young's modulus of the first resin layer 14 is decreased, thus reducing the thermal stress applied to the junction between the conductive layer 11 and the via conductor 12. Moreover, the first filler particle 23 is restrained from jutting toward the conductive layer 11 and the via conductor 12 from the first resin layer 14, thus suppressing occurrence of cracking in the junction between the conductive layer 11 and the via conductor 12 caused by the protrusion of the first filler particle 23.

The first filler particles 23 are smaller in average particle size than the second filler particles 25. This helps suppress occurrence of cracking in the junction between the conductive layer 11 and the via conductor 12 caused by the protrusion of the first filler particle 23.

As shown in FIG. 1(b), the earlier described inner wall W of the via hole V that penetrates the insulating layer 10 in the thickness direction thereof includes a first region W1 defined by a side face of the first resin layer 14, a second region W2 defined by one main face of the inorganic insulating layer 13 located on the first resin layer 14 side, and a third region W3 defined by a side face of the inorganic insulating layer 13. In consequence of designing the inner wall W of the via hole V to include the first to third regions W1 to W3, it is possible to impart a moderate radius to the corner of the insulating layer 10 located at the junction between the conductive layer 11 and the via conductor 12, and thereby disperse the thermal stress applied to the junction between the conductive layer 11 and the via conductor 12. This makes it possible to suppress occurrence of cracking in the junction between the conductive layer 11 and the via conductor 12, and thereby suppress a break of the wiring of the wiring board 3, and thus obtain the wiring board 3 which is excellent in electrical reliability.

The earlier described inner wall W of the via hole V that penetrates the insulating layer 10 in the thickness direction thereof further includes a fourth region W4 defined by the other main face of the inorganic insulating layer 13 and a fifth region W5 defined by a side face of the second resin layer 15. Consequently, when the wiring board 3 is warped due to the difference in thermal expansion coefficient between the wiring board 3 and the electronic component 2, the via conductor 12 can be secured in the thickness direction by the fourth region W4, thus suppressing a tilt of the via conductor 12 caused by the warpage of the wiring board 3. This makes it possible to suppress separation of the via conductor 12 from the conductive layer 11 at a bottom B of the via hole V, and thereby suppress a break of the wiring of the wiring board 3. Especially, when the via conductors 12 are arranged in a row in the direction of the thickness of the wiring board 3 to constitute a stack via structure, a stress resulting from the warpage of the wiring board 3 tends to be applied to the via conductor 12, thus suppressing separation of the via conductor 12 from the conductive layer 11 successfully.

For example, the width of the second region W2 falls in the range of 0.2 µm or above and 5 µm or below. For example, the width of the fourth region W4 falls in the range of 0.2 µm or above and 5 µm or below. It is preferable that the second region W2 has the same width as that of the fourth region W4. In this case, variation in width between the second region W2 and the fourth region W4 is held within a tolerance of ±30%. The width of the second region W2 refers to the length of the second region W2 from one end located on the first region W1 side to the other end located on the third region W3 side. Moreover, the width of the fourth region W4 refers to the length of the fourth region W4 from one end located on the third region W3 side to the other end located on the fifth region W5 side.

In the inner wall W of the via hole V of the present embodiment, an inclination angle A1 of the first region W1 relative to a penetrating direction of the via hole V is greater than an inclination angle A2 of the third region W3 relative to the penetrating direction of the via-hole V. This makes it possible to impart a more moderate radius to the corner of the insulating layer 10 located at the junction between the conductive layer 11 and the via conductor 12, and thereby achieve further dispersion of the thermal stress applied to the junction between the conductive layer 11 and the via conductor 12. The inclination angle A1, A2 refers to an angle formed between the inner wall W and an imaginary line segment L1, L2 extending from within the via hole V to the inner wall W of the via hole V in a direction parallel to the penetrating direction of the via-hole. For example, the inclination angle A1 falls in the range of 5° or above and 70° or below. For example, the inclination angle A2 falls in the range of 2° or above and 30° or below.

The conductive layers 11, which are spaced apart from each other in the thickness direction or in the direction of the main face, serve as wiring such as grounding wiring, power supply wiring, or signal wiring. The conductive layer 11 is made of an electrically-conductive material such for example as copper. Moreover, for example, the thickness of the conductive layer 11 falls in the range of 3 μm or above and 20 μm or below. For example, the coefficient of thermal expansion of the conductive layer 11 in each direction falls in the range of 14 ppm/° C. or above and 18 ppm/° C. or below. Moreover, for example, the Young's modulus of the conductive layer 11 falls in the range of 70 GPa or above and 150 GPa or below. The Young's modulus of the conductive layer 11 is determined by a measurement method in compliance with ISO 14577-1: 2002 using NANOINDENTER XP manufactured by MTS Systems Corporation. In what follows, the Young's modulus of each member will be determined by a measurement method similar to that adopted for the conductive layer 11.

Moreover, the conductive layer 11 comprises: metal foil 26 bonded to the first resin layer 14; an electroless plating layer 27 which adheres to the metal foil 26; and an electroplating layer 28 which adheres to the electroless plating layer 27.

For example, rolled copper foil, electrolytic copper foil or the like may be used as the metal foil 26. As compared with an electroless plating, the rolled copper foil or electrolytic copper foil has fewer lattice defects and thus exhibits high strength. For example, the thickness of the metal foil 26 falls in the range of 0.2 μm or above and 4 μm or below.

The metal foil 26 comprises: an adherent portion 29 bonded to the first resin layer 14; and a projection 30 protruding from the first resin layer 14 toward the via hole V. Consequently, the projection 30 of the metal foil 26 is capable of securing the via conductor 12 in the thickness direction, wherefore the via conductor 12 is restrained against a tilt caused by the warpage of the wiring board 3, and it is thus possible to suppress separation of the via conductor 12 from the conductive layer 11 at the bottom B of the via hole V.

As the electroless plating layer 27, for example, use can be made of an electroless copper plate or the like. For example, the thickness of the electroless plating layer 27 falls in the range of 0.3 μm or above and 3 μm or below. As the electroplating layer 28, for example, use can be made of an electrolytic copper plate. For example, the thickness of the electroplating layer 28 falls in the range of 5 μm or above and 30 μm or below.

The via conductor 12, which provides electrical connection between the conductive layers 11 spaced apart from each other in the thickness direction, serves as wiring in conjunction with the conductive layers 11. The via conductor 12 is filled in the via hole V. The via conductors 12 mutually connected in the buildup layer 6 located on the electronic component 2 side are arranged in a row in the direction of the thickness of the wiring board 3 to constitute a stack via structure. Moreover, the via conductor 12 is made of a material similar to that constituting the conductive layer 11, and has characteristics similar to those of the conductive layer 11.

Moreover, the via conductor 12 comprises: an electroless plating film 31 which adheres to the inner wall W and the bottom B of the via hole V; and an electroplating portion 32 filled in the via hole V while adhering to the electroless plating film 31. The electroless plating film 31 is formed integrally with the electroless plating layer 27 of the conductive layer 11 bonded to the first resin layer 14. The electroplating portion 32 is formed integrally with the electroplating layer 28 of the conductive layer 11 bonded to the first resin layer 14.

Part of the electroplating portion 32 of the via conductor 12 is disposed between the second region W2 and the projection 30. In consequence of disposing part of the electroplating portion 32 which is higher in strength than the electroless plating film 31 between the second region W2 and the projection 30, it is possible to secure the via conductor 12 more firmly in the thickness direction.

When the wiring board 3 is subjected to heat at the time of installation or actuation of the electronic component 2, due to the difference in thermal expansion coefficient between the inorganic insulating layer 13 and the via conductor 12 in the thickness direction, a thermal stress is applied between the via conductor 12 and the inner wall W of the via hole V.

Meanwhile, as shown in FIGS. 2(a) and 2(b), the inorganic insulating layer 13 of the present embodiment includes: a first section 33 comprising a plurality of the inorganic insulating particles 16 partly connected to each other and the resin portion 18 located in the gaps 17 between the inorganic insulating particles 16; and a second section 34 which is interposed between the first section 33 and the via conductor 12, comprising a plurality of inorganic insulating particles 16 partly connected to each other and the conductor portion 19 composed of part of the via conductor 12 which is located in gaps 17 between the inorganic insulating particles 16.

In consequence of designing the first section 33 to include the inorganic insulating particles 16 and the resin portion 18 which becomes elastically deformed more easily than the inorganic insulating particle 16, the coefficient of thermal expansion of the first section 33 can be approximated to the coefficient of thermal expansion of the inorganic insulating particle 16, wherefore the coefficient of thermal expansion of the first section 33 can be decreased, thus decreasing the coefficient of thermal expansion of the inorganic insulating layer 13. Moreover, the second section 34 includes the inorganic insulating particles 16 and the conductor portion 19 composed of part of the via conductor 12, wherefore the value of the thermal expansion coefficient of the second section 34 falls in between the coefficient of thermal expansion of the first section 33 and the coefficient of thermal expansion of the via conductor 12. The interposition of the second section 34 between the first section 33 and the via conductor 12 enables reduction of the thermal stress applied between the via conductor 12 and the inner wall W of the via hole V, thus suppressing separation of the via conductor 12 from the inner wall W of the via hole V. This makes it possible to suppress occurrence of cracking in the junction between the via conductor 12 and the conductive layer 11 caused by the separation, and thereby suppress a break of the wiring of the wiring board 3, and thus obtain the wiring board 3 having excellent electrical reliability.

Moreover, as shown in FIG. 1(b), the plurality of inorganic insulating particles 16 in the first section 33 and the second section 34 include: the plurality of first inorganic insulating particles 20 partly connected to each other; and the plurality of second inorganic insulating particles 21, which are greater in average particle size than the first inorganic insulating particles 20, spaced away from each other across the first inorganic insulating particle 20. Consequently, in both of the first section 33 and the second section 34, the inorganic insulating particles 16 include the first inorganic insulating particles 20 and the second inorganic insulating particles 21, wherefore the rate of filling the inorganic insulating particles 16 in the first section 33 and the rate of filling the inorganic insulating particles 16 in the second section 34 can be approximated to each other, thus bringing the coefficient of thermal expansion of the first section 33 close to that of the second section 34. This makes it possible to reduce the thermal stress applied between the first section 33 and the second section 34, and thereby suppress separation of the first section 33 and the second section 34 from each other. It is thus suppressed that the separation is increased and reaches the conductive layer 11, wherefore occurrence of cracking in the conductive layer 11 can be suppressed.

Moreover, the content percentage of the inorganic insulating particles 16 in the second section 34 is lower than the content percentage of the inorganic insulating particles 16 in the first section 33. Consequently, in the first section 33, the content percentage of the inorganic insulating particles 16 can be increased to achieve a decrease in thermal expansion coefficient, whereas, in the second section 34, the content percentage of the inorganic insulating particles 16 can be reduced to facilitate the filling of the conductor portion 19 composed of part of the via conductor 12 in the gaps 17. Especially, when the via conductor 12 is formed by plating, easy recirculation of a plating solution within the gaps 17 helps suppress occurrence of voids in a part of the gaps 17 in which the conductor portion 19 is not filled. This makes it possible to increase the strength of adhesion between the second section 34 and the via conductor 12, and thereby suppress separation of the second section 34 and the via conductor 12 from each other.

The second section 34 is located near the via conductor 12 in the inorganic insulating layer 13, and, for example, the width of the second section 34 (the length of the second section 34 from one end located on the via conductor 12 side to the other end which is opposite to the via conductor 12) falls in the range of 1 μm or above and 5 μm or below. For example, the content percentage of the inorganic insulating particles 16 in the first section 33 falls in the range of 60% by volume or above and 90% by volume or below. For example, the content percentage of the inorganic insulating particles 16 in the second section 34 falls in the range of 40% by volume or above and 70% by volume or below.

Moreover, one main face of the second section 34 located on the conductive layer 11 side is exposed from the first resin layer 14 and constitutes the inner wall W of the via hole V. That is, one main face of the second section 34 constitutes the second region W2 of the inner wall W. Consequently, part of the via conductor 12 that adheres to the second region W2 acts to secure the second section 34 in the thickness direction, and therefore it is possible to suppress separation of the second section 34 and the via conductor 12 from each other. This helps suppress occurrence of cracking in the junction between the conductive layer 11 and the via conductor 12.

Moreover, the other main face of the second section 34 which is a main face opposite to a conductive layer 11 side main face of the second section 34 is exposed from the second resin layer 15 and constitutes the inner wall W of the via hole V. That is, the other main face of the second section 34 constitutes the fourth region W4 of the inner wall W. Consequently, part of the via conductor 12 that adheres to the fourth region W4 acts to secure the second section 34 in the thickness direction, and therefore it is possible to suppress separation of the second section 34 and the via conductor 12 from each other. This helps suppress occurrence of cracking in the junction between the conductive layer 11 and the via conductor 12.

Moreover, part of the electroless plating film 31 finds its way into the gaps 17 of the second section 34, and constitutes the conductor portion 19. This makes it possible to fill part of the via conductor 12 in the gaps 17 of the second section 34 successfully, and thereby suppress separation of the second section 34 and the via conductor 12 from each other.

Moreover, part of the electroplating portion 32 finds its way into the gaps 17 of the second section 34 together with part of the electroless plating film 31, and constitutes the conductor portion 19. Part of the electroless plating film 31 constituting the conductor portion 19 is interposed between part of the electroplating portion 32 constituting the conductor portion 19 and the resin portion 18. In addition, the other part of the electroless plating film 31 adheres to the first region W1 and the fifth region W5 of the inner wall W.

A method of manufacturing the mounting structure 1 thus far described will next be explained with reference to FIGS. 3 to 10.

Figure 3:
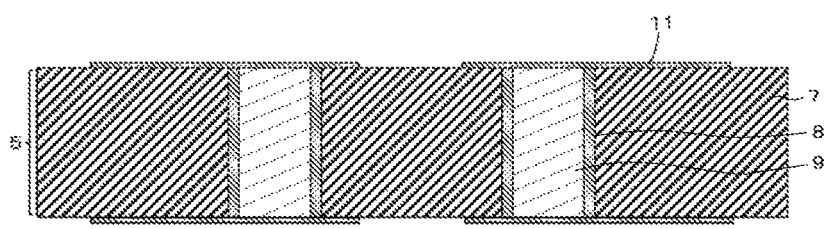
FIGS. 3($a$) to 3($c$) are sectional views for explaining process steps for the manufacture of the mounting structure shown in FIG. 1($a$), and FIG. 3($d$) is an enlarged sectional view showing a portion corresponding to the part R2 depicted in FIG. 1($b$), for explaining the process steps for the manufacture of the mounting structure shown in FIG. 1($a$)
Figure 3:
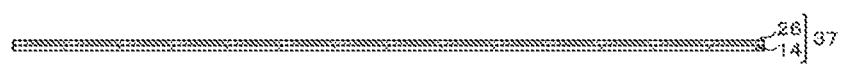
Figure 3:
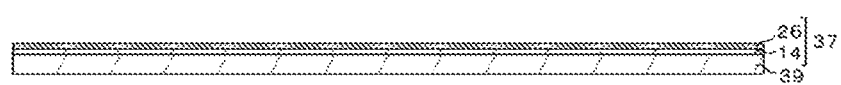
Figure 3:
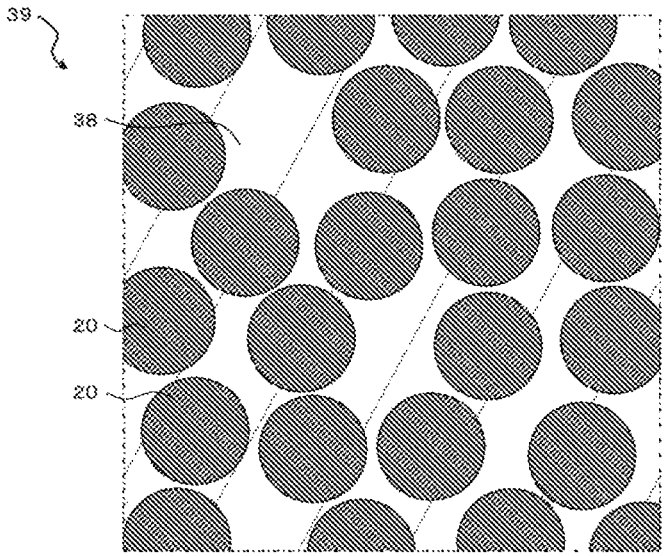

(1) A core substrate 5 is produced as shown in FIG. 3(*a*). The following describes specific examples of procedures in the production.

There is prepared a laminate plate comprising: a base body 7 obtained by curing a prepreg; and metal foil, such as copper foil, placed on each main face of the base body 7. Next, through holes are formed in the laminate plate by means of lasering, drilling, or otherwise. Next, a cylindrical through hole conductor 8 is formed by depositing an electrically-conductive material into the through hole by means of electroless plating, electroplating, vapor deposition, sputtering, or otherwise. Next, an insulator 9 is formed by filling a resin in an uncured state inside the through hole conductor 8 and then curing the uncured resin. Next, a conductive layer 11 is formed by depositing an electrically-conductive material onto the insulator 9 by means of electroless plating, electroplating, or otherwise, and then performing patterning on the metal foil and the conductive material placed on the base body 7. Thereby, the core substrate 5 can be produced.

(2) A laminate sheet 36 is produced as shown in FIGS. 3(*b*) to 6(*a*). The laminate sheet 36 comprises: metal foil 26 such as copper foil; an inorganic insulating layer 13 placed on the metal foil 26; and a resin layer precursor 35 containing an uncured resin placed on the inorganic insulating layer 13. The following describes specific examples of procedures in the production.

Figure 4:
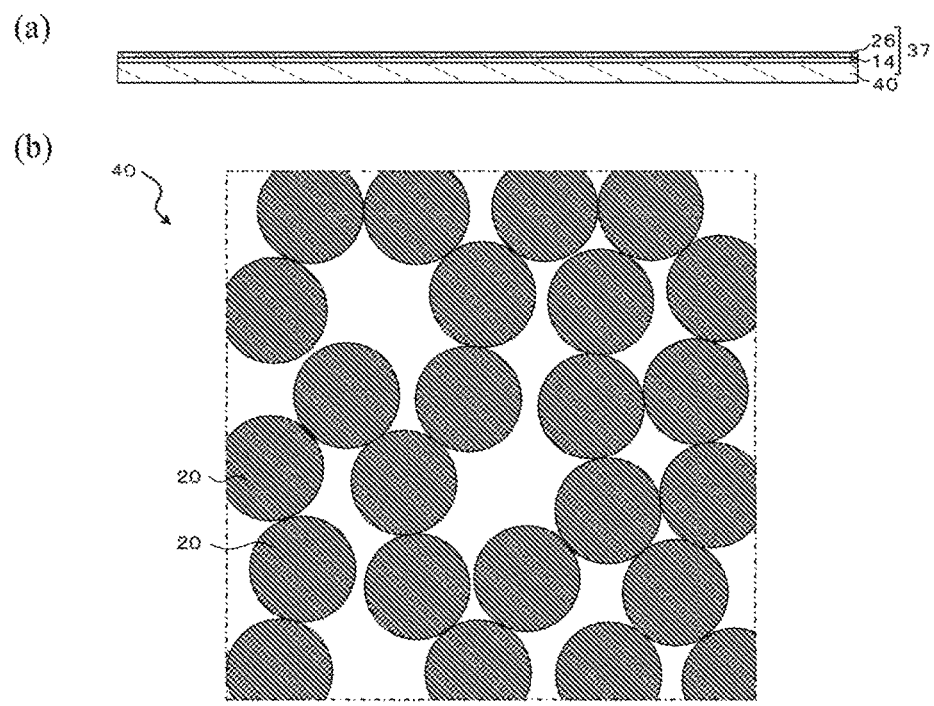
FIG. 4($a$) is a sectional view for explaining process steps for the manufacture of the mounting structure shown in FIG. 1($a$), and FIG. 4($b$) is an enlarged sectional view showing a portion corresponding to the part R2 depicted in FIG. 1($b$), for explaining the process steps for the manufacture of the mounting structure shown in FIG. 1($a$)
Figure 5:
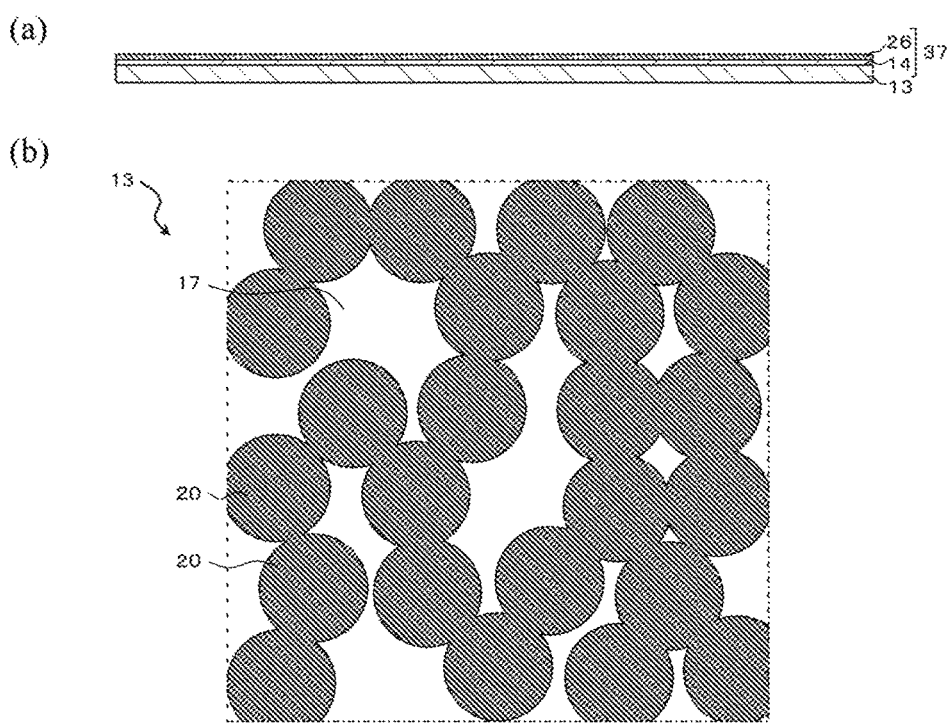
FIG. 5($a$) is a sectional view for explaining process steps for the manufacture of the mounting structure shown in FIG. 1($a$), and FIG. 5($b$) is an enlarged sectional view showing a portion corresponding to the part R2 depicted in FIG. 1($b$), for explaining the process steps for the manufacture of the mounting structure shown in FIG. 1($a$)

First, as shown in FIG. 3(*b*), there is prepared resin-bearing metal foil 37 comprising metal foil 26 and a first resin layer 14 placed on the metal foil 26. Next, as shown in FIGS. 3(*c*) and 3(*d*), there is prepared a slurry 39 containing inorganic insulating particles 16 and a solvent 38 within which the inorganic insulating particles 16 get dispersed, and then the slurry 39 is applied to one main face of the first resin layer 14. Next, as shown in FIGS. 4(*a*) and 4(*b*), a powder layer 40 is formed by evaporation of the solvent 38 from the slurry 39 to leave the inorganic insulating particles 16 on the metal foil 26 so that the remaining inorganic insulating particles 16 constitute the powder layer 40. In the powder layer 40, first inorganic insulating particles 20 are brought into contact with each other at their mutually closest points. Next, as shown in FIGS. 5(*a*) and 5(*b*), an inorganic insulating layer 13 which is greater in thickness than the first resin layer 14 is formed by heating the powder layer 40 to cause the adjacent first inorganic insulating particles 20 to connect to each other at their mutually closest points.

Figure 6:
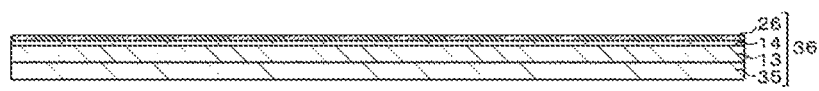
FIGS. 6($a$) to 6($c$) are sectional views for explaining process steps for the manufacture of the mounting structure shown in FIG. 1($a$), and FIG. 6($d$) is an enlarged sectional view showing a part R4 depicted in FIG. 6($c$)
Figure 6:
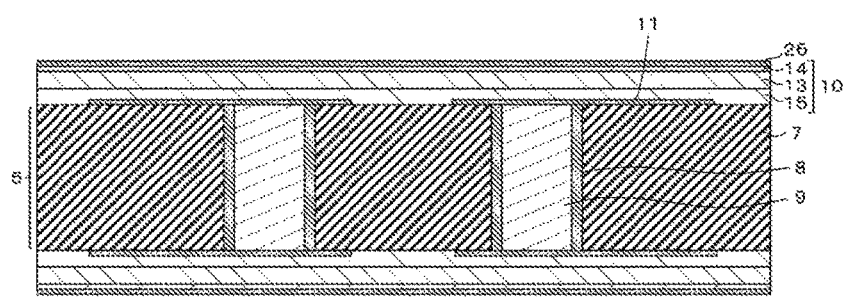
Figure 6:
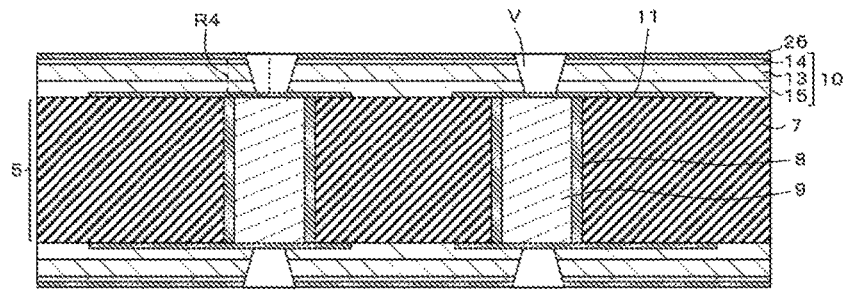
Figure 6:
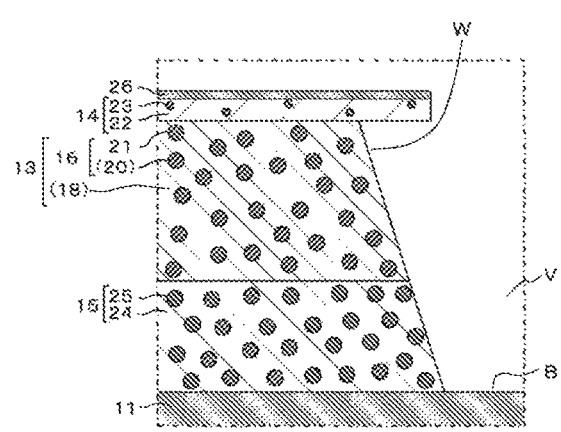
Figure 7:
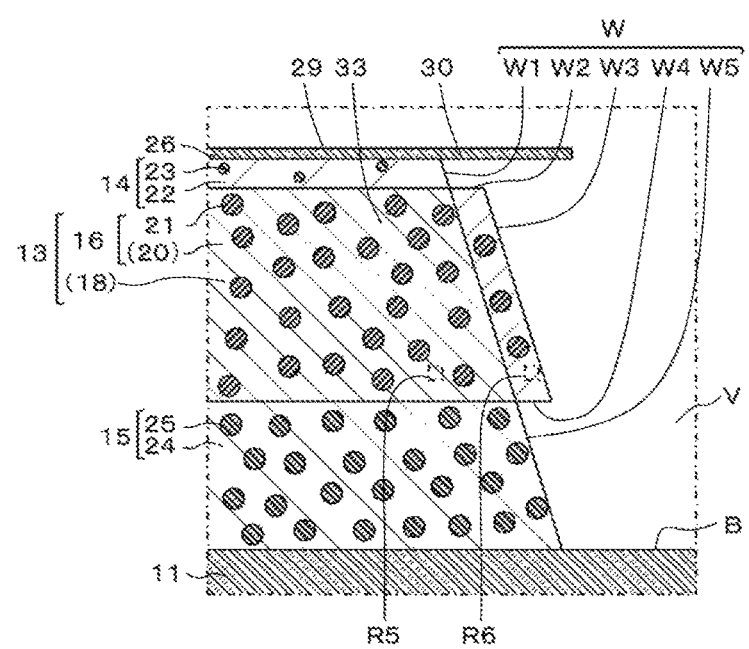
FIG. 7($a$) is an enlarged sectional view showing a portion corresponding to the part R4 depicted in FIG. 6($c$), for explaining the process steps for the manufacture of the mounting structure shown in FIG. 1($a$), and FIG. 7($b$) is an enlarged sectional view showing a part R5 depicted in FIG. 7($a$)
Figure 7:
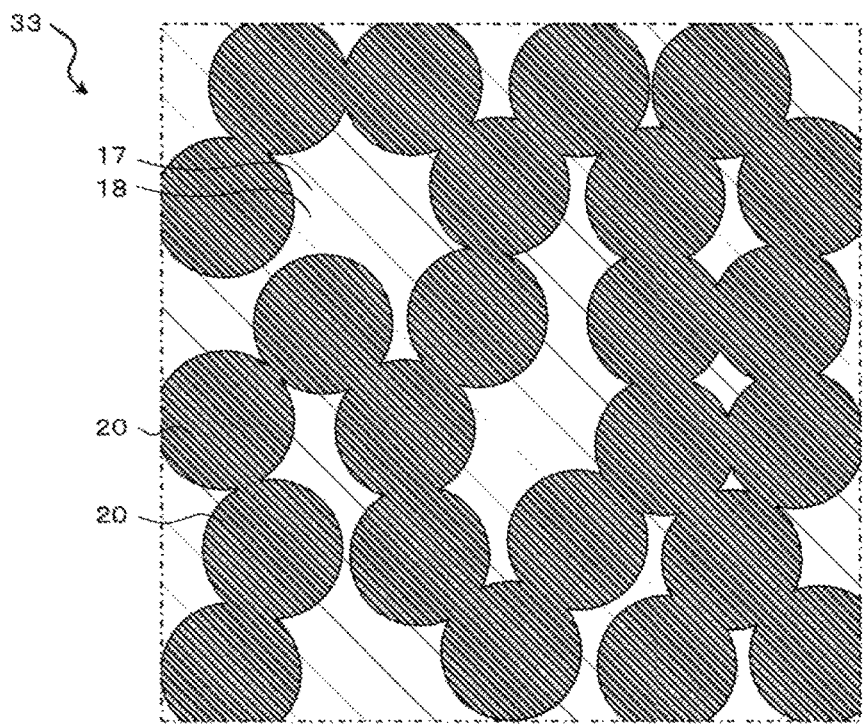
Figure 8:
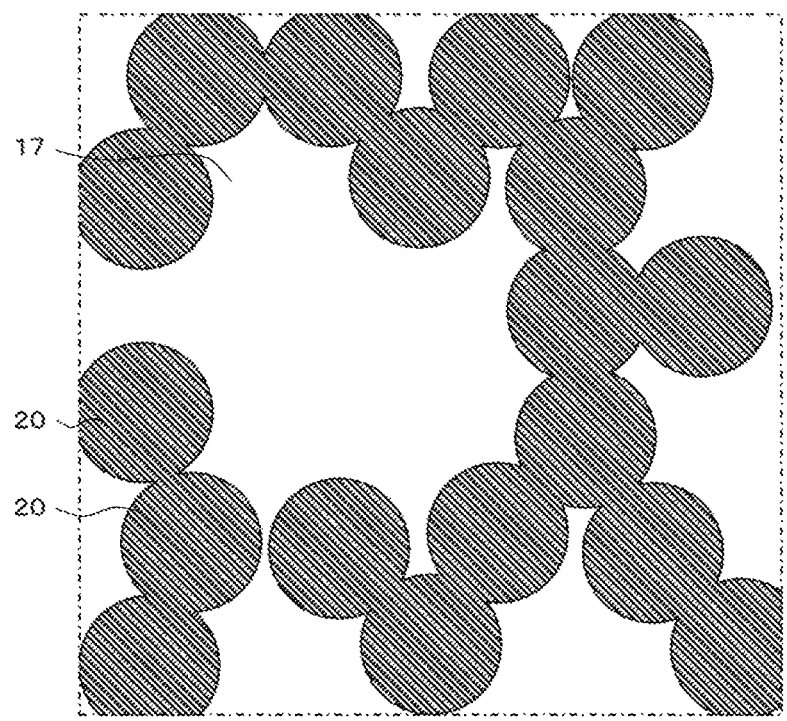
FIG. 8(a) is an enlarged sectional view showing a part R6 depicted in FIG. 7(a)
FIG. 8(b) is an enlarged sectional view showing a portion corresponding to the part R4 depicted in FIG. 6(c), for explaining the process steps for the manufacture of the mounting structure shown in FIG. 1(a)
Figure 8:
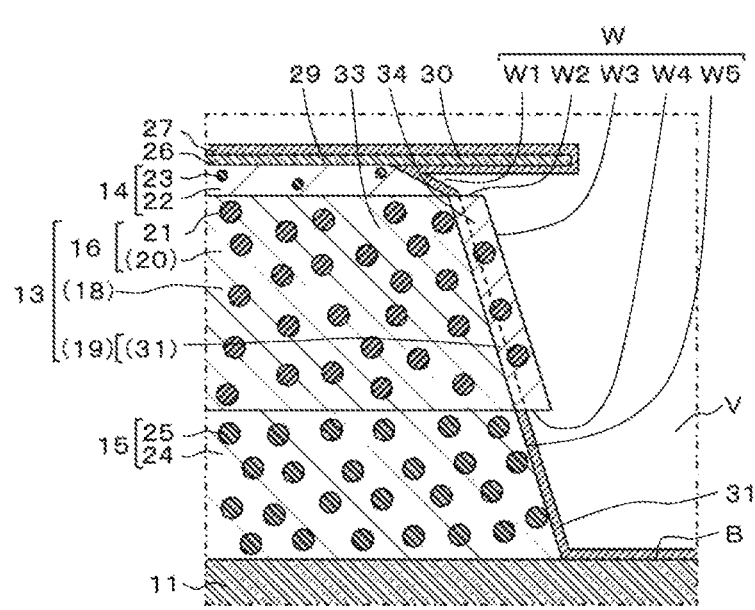
Figure 9:
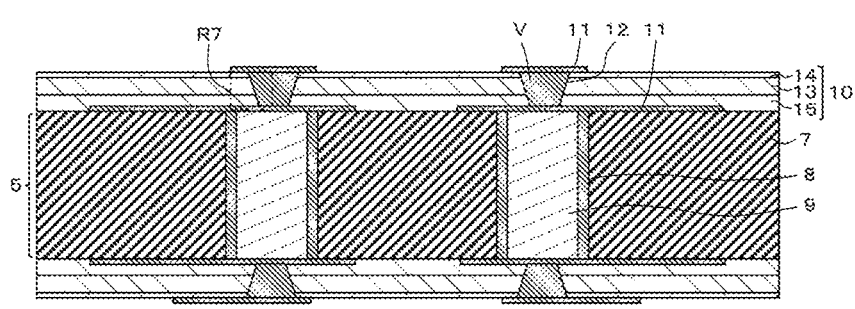
FIG. 9(a) is a sectional view for explaining process steps for the manufacture of the mounting structure shown in FIG. 1(a)
FIG. 9(b) is an enlarged sectional view showing a part R7 depicted in FIG. 9(a)
Figure 9:
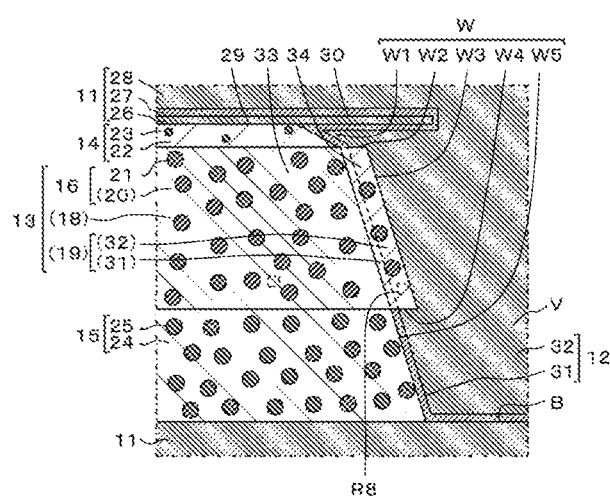
Figure 10:
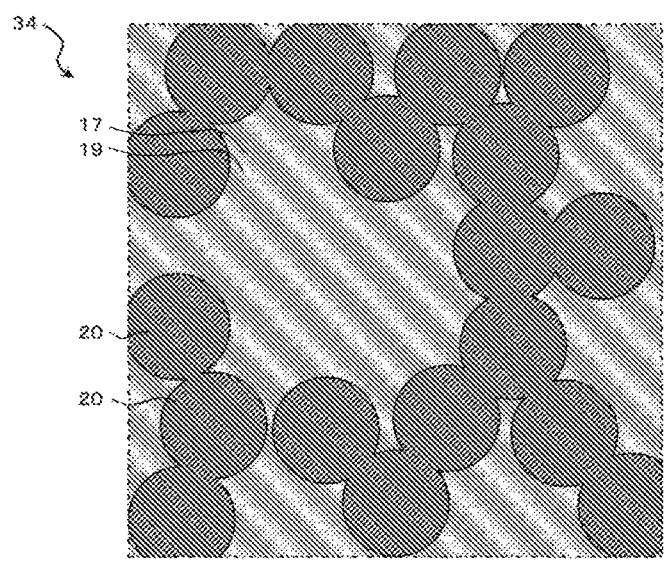
FIG. 10(a) is an enlarged sectional view showing a part R8 depicted in FIG. 9(b)
FIG. 10(b) is a sectional view for explaining process steps for the manufacture of the mounting structure shown in FIG. 1(a).
Figure 10:
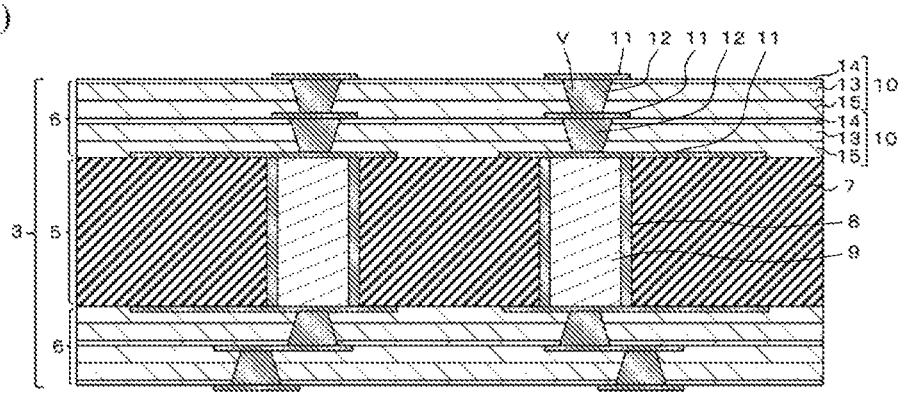

Next, as shown in FIG. 6(*a*), the resin layer precursor 35 containing an uncured resin which becomes a second resin 24 and second filler particles 25 is laminated onto the inorganic insulating layer 13, and then heat and pressure are applied to a stack of the inorganic insulating layer 13 and the resin layer precursor 35 in the thickness direction so that part of the resin layer precursor 35 is filled in gaps 17. Thereby, the laminate sheet 36 can be produced.

According to the method of manufacturing the wiring board 3 of the present embodiment, the plurality of first inorganic insulating particles 20 having an average particle size in the range of 3 nm or above and 110 nm or below, and the slurry 39 containing the solvent 38 within which the first inorganic insulating particles 20 get dispersed are applied onto the metal foil 26. In consequence of setting the average particle size of the first inorganic insulating particles 20 in the range of 3 nm or above and 110 nm or below, even under low temperature conditions, the plurality of first inorganic insulating particles 20 are partly connected to each other firmly. This is presumably because, since the first inorganic insulating particles 20 are minute fine particles, it follows that the atoms of the first inorganic insulating particles 20, in particular, the atoms at the particle surfaces move actively, wherefore the plurality of first inorganic insulating particles 20 are partly connected to each other firmly at lower temperatures.

It is thus possible to cause the plurality of first inorganic insulating particles 20 to connect to each other firmly under low temperature conditions, for example, at a temperature lower than a crystallization starting temperature of the first inorganic insulating particles 20, or even at a temperature as low as 250° C. or below. Moreover, such a low-temperature heating process makes it possible to cause the individual first inorganic insulating particles 20, as well as the first inorganic insulating particle 20 and the second inorganic insulating particle 21, to connect with each other only at their mutually closest points, while keeping the first inorganic insulating particle 20 and the second inorganic insulating particle 21 in shape. Consequently, the connection part between the individual first inorganic insulating particles 20, as well as the connection part between the first inorganic insulating particle 20 and the second inorganic insulating particle 21, constitutes a necked-down structure, and also the gaps 17 in open-pore form can be created readily. For example, a temperature at which the individual first inorganic insulating particles 20 can be connected together firmly is about 250° C. for a case where the average particle size of the first inorganic insulating particles 20 is set at 110 nm, or is about 150° C. for a case where the average particle size of the first inorganic insulating particles 20 is set at 15 nm.

Moreover, according to the method of manufacturing the wiring board 3 of the present embodiment, the slurry 39 further containing the plurality of second inorganic insulating particles 21 having an average particle size in the range of 0.5 μm or above and 5 μm or below is applied onto the metal foil 26. In consequence of the inclusion of the second inorganic insulating particles 21 that are greater in average particle size than the first inorganic insulating particles 20, clearance between the inorganic insulating particles 16 in the slurry 39 is reduced, thus reducing a shrinkage of the powder layer 40 formed by evaporation of the solvent 38. The reduction of the shrinkage of the flat-shaped powder layer 40 which tends to shrink greatly in the direction of the main face helps suppress occurrence of cracking in the powder layer 40 in the thickness direction.

For example, the content percentage of the inorganic insulating particles 16 in the slurry 39 falls in the range of 10% by volume or above and 50% by volume or below, and, the content percentage of the solvent 38 in the slurry 39 falls in the range of 50% by volume or above and 90% by volume or below. As the solvent 38, for example, use can be made of an organic solvent containing methanol, isopropanol, methyl ethyl ketone, methyl isobutyl ketone, xylene, or a mixture of two or more selected from among the above substances.

For example, the slurry 39 is dried by application of heat and air-drying process. For example, the drying temperature is higher than or equal to 20° C., but lower than the boiling point of the solvent 38, and, the drying time falls in the range of 20 seconds or above and 30 minutes or below.

A heating temperature at the time of heating the powder layer 40 is higher than or equal to the boiling point of the solvent 38, but lower than the crystallization starting temperature of the first inorganic insulating particles 20, or falls in the range of 100° C. or above and 250° C. or below. Moreover, for example, the heating time falls in the range of 0.5 hours or above and 24 hours or below.

In heating and pressurizing the stack of the inorganic insulating layer 13 and the resin layer precursor 35, for example, the pressure to be applied falls in the range of 0.05 MPa or above and 0.5 MPa or below, the pressurizing time falls in the range of 20 seconds or above and 5 minutes or below, and the heating temperature falls in the range of 50° C. or above and 100° C. or below. This heating temperature is lower than a curing staring temperature of the resin layer precursor 35, wherefore the resin layer precursor 35 can be maintained in an uncured state.

(3) As shown in FIGS. 6(b) to 10(a), an insulating layer 10 is formed by laminating the laminate sheet 36 onto the core substrate 5, and, after the via hole V is formed in the insulating layer 10, the conductive layer 11 and the via conductor 12 are formed. The following describes specific examples of procedures in the formation.

First, the resin layer precursor 35 is located on the core substrate 5 side to laminate the laminate sheet 36 onto the core substrate 5. Next, heat and pressure are applied to a stack of the core substrate 5 and the laminate sheet 36 in the thickness direction so that the laminate sheet 36 is bonded to the core substrate 5. Next, as shown in FIG. 6(b), heat is applied to the resin layer precursor 35 to cure the uncured resin into the second resin 24, whereupon the resin layer precursor 35 becomes a second resin layer 15. Consequently, the insulating layer 10 comprising the first resin layer 14 and the inorganic insulating layer 13 which is greater in thickness than the first resin layer 14 can be formed. At this time, part of the resin layer precursor 35 which has found its way into the gaps 17 in the procedural step (2) becomes the resin portion 18.

Next, as shown in FIGS. 6(c) and 6(d), the via hole V is formed so as to penetrate the insulating layer 10 in the thickness direction thereof by lasering process, and more specifically applying laser light in a direction from the metal foil 26 to the insulating layer 10. At this time, the conductive layer 11 is exposed at the bottom B of the via hole V. Moreover, the projection 30 is formed in the resin-bearing metal foil 37 protruding from the inorganic insulating layer 13 toward the via hole V.

Next, as shown in FIGS. 7(a) to 8(a), a cavity is formed by removing the resin portion 18 from a part of the gaps 17 located near the inner wall W of the via hole V in the inorganic insulating layer 13 with use of an etchant. In the other part of the gaps 17 in the inorganic insulating layer 13, the resin portion 18 is left to form the first section 33. Moreover, part of the first resin layer 14 is removed by the etchant, so that the second region W2 defined by first resin layer 14-facing one main face of the inorganic insulating layer 13 is exposed at the inner wall W of the via hole V. At this time, in the metal foil 26 is formed the projection 30 protruding from the inorganic insulating layer 13 toward the via hole V. Moreover, part of the second resin layer 15 is removed by the etchant, so that the fourth region W4 defined by second resin layer 15-facing one main face of the inorganic insulating layer 13 is exposed at the inner wall W of the via hole V. In addition, part of the inorganic insulating particles 16 is dissolved by the etchant, so that the content percentage of the inorganic insulating particles 16 in the second section 34 is lower than the content percentage of the inorganic insulating particles 16 in the first section 33.

Next, as shown in FIG. 8(b), the electroless plating layer 27 which adheres to the metal foil 26 and the electroless plating film 31 which adheres to the inner wall W and the bottom B of the via hole V are integrally formed by electroless plating technique. At this time, part of the electroless plating film 31 is located in a part of the gaps 17 from which the resin portion 18 has been removed. Next, a resist of desired pattern is formed in the electroless plating layer 27. Next, as shown in FIGS. 9(a) to 10(a), the electroplating layer 28 which adheres to the electroless plating layer 27 and the electroplating portion 32 which adheres to the electroless plating film 31 are integrally formed by electroplating technique. At this time, the conductor portion 19 is formed by causing part of the electroplating portion 32 to be located in a part of the gaps 17 from which the resin portion 18 has been removed, thus constituting the second section 34. Next, after the removal of the resist using a sodium hydroxide aqueous solution or the like, a part of the electroless plating layer 27 is removed which has been covered with the resist with use of a cupric chloride aqueous solution or sulfuric acid, for example.

Thereby, the via conductor 12 which adheres to the inner wall W of the via hole V and the conductive layer 11 disposed on the first resin layer 14 can be formed, and also, the second section 34 can be formed in the inorganic insulating layer 13 by causing the conductor portion 19 composed of part of the via conductor 12 to be located in a resin portion 18-free part of the gaps 17.

Moreover, according to the method of manufacturing the wiring board 3 of the present embodiment, the removal of part of the first resin layer 14 using an etchant is effected in such a way as to remove the first resin layer 14 at the projection 30 while leaving the metal foil 26 at the projection 30. It thus never occurs that the first resin layer 14 made of a material different from those constituting the via conductor 12 and the conductive layer 11 remains at the junction between the via conductor 12 and the conductive layer 11, wherefore it is possible to suppress occurrence of cracking in the junction between the via conductor 12 and the conductive layer 11.

Moreover, according to the method of manufacturing the wiring board 3 of the present embodiment, after forming the via hole V so as to penetrate the insulating layer 10 in the thickness direction thereof by applying laser light in a direction from the metal foil 26 to the insulating layer 10, part of the first resin layer 14 is removed with use of an etchant. Consequently, heat is transferred from the metal foil 26 to the first resin layer 14 during laser light irradiation, thus facilitating removal of a region of the first resin layer 14 situated near the metal foil 26 using an etchant. This makes it possible to adjust the inclination angle A1 of the first region W1 to be greater than the inclination angle A2 of the third region W3 at the time of removal of part of the first resin layer 14 using an etchant.

A $CO_2$-laser or an UV-YAG laser may be used in the lasering process to form the via hole V. The $CO_2$-laser is particularly desirable for use. Since the $CO_2$-laser produces laser light of greater wavelength that is reflected from copper with high reflectivity, it follows that the metal foil 26 is less workable than the insulating layer 10, wherefore the projection 30 of the metal foil 26 can be formed with ease. Moreover, the working of the metal foil 26 is time-consuming, wherefore heat is likely to be transferred from the metal foil 26 to the first resin layer 14. This makes it possible to adjust the inclination angle A1 of the first region W1 to be greater than the inclination angle A2 of the third region W3 with ease.

Moreover, the lowering of the power level in the $CO_2$-laser further reduces the workability of the metal foil 26, thus facilitating the formation of the projection 30 of the metal foil 26. In addition, since more time needs to be taken for the working of the metal foil 26, it is possible to adjust the inclination angle A1 of the first region W1 to be greater than the inclination angle A2 of the third region W3 more easily. For example, the $CO_2$-laser power level falls in the range of 4 mJ or above and 6 mmJ or below.

Conditions to be fulfilled in the application of heat and pressure to bond the laminate sheet 36 to the core substrate 5 may be similar to those adopted in the procedural step (2).

For example, the heating temperature at which the uncured resin is cured into the second resin 24 is higher than or equal to the curing starting temperature of the uncured resin, but lower than the thermal decomposition temperature of the uncured resin, and, for example, the heating time falls in the range of 10 minutes or above and 120 minutes or below.

An alkaline solution such as a sodium hydroxide aqueous solution may be used as an etchant for removing part of the first resin layer 14. For example, time to be taken for the process using the etchant falls in the range of 1 minute or above and 15 minutes or below.

(4) As shown in FIG. 10(b), by repeating the procedural steps (2) and (3), the buildup layer 6 is formed on the core substrate 5, whereupon the wiring board 3 is produced. A repeat of this process can impart a multi-layered form to the wiring layer 6.

(5) A mounting structure 1 as shown in FIG. 1(a) is produced by flip-chip mounting the electronic component 2 on the wiring board 3 via a bump 4. The electronic component 2 may either be electrically connected to the wiring board 3 by means of wire bonding or be built into the wiring board 3.

It should be understood that the invention is not limited to the embodiments described heretofore, and that various changes, modifications, and combinations are possible without departing from the scope of the invention.

For example, although the description of the foregoing embodiment of the invention deals with the case where the buildup layer 6 comprises the inorganic insulating layer 13, the first resin layer 14, and the second resin layer 15, the core substrate 5 can be provided with configurations corresponding to the inorganic insulating layer 13, the first resin layer 14, and the second resin layer 15. In this case, the second section of the inorganic insulating layer of the core substrate 5 includes a conductor portion composed of part of a through hole conductor (through conductor).

For example, although the description of the foregoing embodiment of the invention deals with the case where the buildup layer 6 comprises the inorganic insulating layer 13, the first resin layer 14, and the second resin layer 15, and, the inner wall W of the via hole V has the first to fifth regions W1 to W5, the core substrate 5 can be provided with configurations corresponding to the inorganic insulating layer 13, the first resin layer 14, and the second resin layer 15, and, the inner wall of a through hole that penetrates the core substrate 5 in the thickness direction thereof can be provided with regions corresponding to the first to fifth regions W1 to W5. In this case, a through hole conductor 8 (through conductor) adheres to the inner wall of the through hole.

Moreover, although the description of the foregoing embodiment of the invention deals with the case where a buildup multilayer board composed of the core substrate 5 and the buildup layer 6 is used as the wiring board 3, the wiring board 3 can be of another type, for example, a single-layer board composed solely of the core substrate 5 or a coreless board composed solely of the buildup layer 6.

Moreover, although the description of the foregoing embodiment of the invention deals with the case where the insulating layer 10 comprises the inorganic insulating layer 13, the first resin layer 14, and the second resin layer 15, it is sufficient that the insulating layer 10 comprise the inorganic insulating layer 13, and thus the first resin layer 14 and the second resin layer 15 do not necessarily have to be provided.

Moreover, although the description of the foregoing embodiment of the invention deals with the case where the inorganic insulating particles 16 include the second inorganic insulating particles 21, the inorganic insulating particles 16 do not necessarily have to include the second inorganic insulating particles 21.

Although the description of the foregoing embodiment of the invention deals with the case where the resin portion 18 is part of the second resin layer 15 which has found its way into the gaps 17, the resin portion 18 can be part of the first resin layer 14 which has found its way into the gaps 17, or formed of part of the first resin layer 14 and part of the second resin layer 15. In this case, the strength of adhesion between the inorganic insulating layer 13 and the first resin layer 14 can be increased.

Although the description of the foregoing embodiment of the invention deals with the case where the via conductor 12 is filled in the via hole V, it is sufficient that the via conductor 12 adhere to the inner wall W of the via hole V, and thus the via conductor 12 can be given a film form.

Although the description of the foregoing embodiment of the invention deals with the case where the inclination angle A1 of the first region W1 is greater than the inclination angle A2 of the third region W3, the inclination angle A1 of the first region W1 and the inclination angle A2 of the third region W3 can be identical with each other. In this case, the adherent portion 29 of the metal foil 26 can be extended more greatly toward the via hole V, thus allowing the projection 30 to secure the via conductor 12 in the thickness direction more firmly.

Although the description of the foregoing embodiment of the invention deals with the case where the first resin layer 14 includes the first filler particles 23, the first resin layer 14 can be composed solely of the first resin 22 without inclusion of the first filler particles 23.

Although the description of the foregoing embodiment of the invention deals with the case where the conductive layer 11 includes the metal foil 26, the conductive layer 11 can be composed of the electroless plating layer 27 and the electroplating layer 28 without the metal foil 26. In this case, in the procedural step (3), after the formation of the insulating layer 10 and prior to the formation of the via hole V, the metal foil 26 is removed chemically or mechanically, and then the electroless plating layer 27 and the electroplating layer 28 are formed. Moreover, a resin sheet, such as a PET film, can be used as a support body instead of the metal foil 26.

Although the description of the foregoing embodiment of the invention deals with the case where the metal foil 26 includes the projection 30, the metal foil 26 can be composed solely of the adherent portion 29 without the projection 30.

Moreover, although the description of the foregoing embodiment of the invention deals with the case where the evaporation of the solvent 38 and application of heat to the powder layer 40 are performed separately in the procedural step (2), the evaporation and the heating operation can be performed at one time.

The invention claimed is:

1. A wiring board, comprising:
    an inorganic insulating layer having a through hole formed so as to penetrate the inorganic insulating layer in a thickness direction thereof;
    a conductive layer disposed on the inorganic insulating layer;
    a through conductor which adheres to an inner wall of the through hole and is connected with the conductive layer,
    the inorganic insulating layer comprising
    a first section including a plurality of inorganic insulating particles partly connected to each other, and a resin portion located in gaps between the inorganic insulating particles, and
    a second section which is interposed between the first section and the through conductor, including a plurality of inorganic insulating particles partly connected to each other, and a conductor portion composed of part of the through conductor which is located in gaps between the inorganic insulating particles; and
    a first resin layer, which is smaller in thickness than the inorganic insulating layer, interposed between the inorganic insulating layer and the conductive layer while being kept in contact with the inorganic insulating layer and the conductive layer,
    one main face of the second section of the inorganic insulating layer located on a conductive layer side being exposed from the first resin layer,
    the inner wall of the through hole including a first region defined by a side face of the first resin layer, a second region defined by the one main face of the inorganic insulating layer exposed from the first resin layer, and a third region defined by a side face of the inorganic insulating layer,
    an inclination angle of the first region relative to a penetrating direction of the through hole being greater than an inclination angle of the third region relative to the penetrating direction of the through hole.

2. The wiring board according to claim 1,
    wherein the plurality of inorganic insulating particles in the first section and the second section include a plurality of first inorganic insulating particles partly connected to each other, and a plurality of second inorganic insulating particles that are greater in average particle size than the first inorganic insulating particles and are spaced away from each other, with the first inorganic insulating particles interposed therebetween.

3. The wiring board according to claim 2,
    wherein an average particle size of the first inorganic insulating particles falls in a range of 3 nm or above and 110 nm or below, and
    an average particle size of the second inorganic insulating particles falls in a range of 0.5 μm or above and 5 μm or below.

4. The wiring board according to claim 1, further comprising:
a second resin layer disposed on the inorganic insulating layer on an opposite side to a conductive layer side of the inorganic insulating layer while being kept in contact with the inorganic insulating layer,
wherein the other main face of the second section of the inorganic insulating layer which is a main face opposite to a conductive layer side main face of the second section of the inorganic insulating layer is exposed from the second resin layer, and
the inner wall of the through hole includes a fourth region defined by the other main face of the inorganic insulating layer exposed from the second resin layer and a fifth region defined by a side face of the second resin layer.

5. The wiring board according to claim 1,
wherein the insulating layer further comprises a second resin layer, which is larger in thickness than the first resin layer, disposed on the inorganic insulating layer on an opposite side to a first resin layer side of the inorganic insulating layer while being kept in contact with the inorganic insulating layer,
the first resin layer comprises a first resin and a plurality of first filler particles dispersed in the first resin,
the second resin layer comprises a second resin and a plurality of second filler particles dispersed in the second resin, and
a content percentage of the first filler particles in the first resin layer is smaller than a content percentage of the second filler particles in the second resin layer.

6. The wiring board according to claim 1,
wherein the conductive layer comprises metal foil bonded to the first resin layer, and an electroplating layer disposed on the metal foil,
the metal foil comprises an adherent portion bonded to the first resin layer, and a projection protruding from the first resin layer toward the through hole, and
part of the through conductor is located between the second region and the projection.

7. A mounting structure, comprising:
the wiring board according to claim 1; and
an electronic component mounted on the wiring board so as to be electrically connected to the conductive layer.

* * * * *